United States Patent
Lim et al.

(10) Patent No.: US 9,478,169 B2
(45) Date of Patent: Oct. 25, 2016

(54) PIXEL, DISPLAY DEVICE HAVING THE SAME, AND THIN FILM TRANSISTOR (TFT) SUBSTRATE FOR DISPLAY DEVICE

(71) Applicant: Samsung Display Co., Ltd., Yongin, Gyeonggi-Do (KR)

(72) Inventors: Jae-Keun Lim, Suwon-si (KR); Chong-Chul Chai, Seoul (KR); Joon-Chul Goh, Hwaseong-si (KR); Mu-Kyung Jeon, Ulsan (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 39 days.

(21) Appl. No.: 14/663,143

(22) Filed: Mar. 19, 2015

(65) Prior Publication Data
US 2016/0104424 A1    Apr. 14, 2016

(30) Foreign Application Priority Data
Oct. 14, 2014    (KR) .......................... 10-2014-0138080

(51) Int. Cl.
| | |
|---|---|
| *G09G 3/32* | (2016.01) |
| *H01L 29/786* | (2006.01) |
| *H01L 27/12* | (2006.01) |
| *H01L 27/32* | (2006.01) |

(52) U.S. Cl.
CPC ......... *G09G 3/3258* (2013.01); *H01L 27/1255* (2013.01); *H01L 27/3276* (2013.01); *H01L 29/78648* (2013.01); *G09G 2310/0278* (2013.01)

(58) Field of Classification Search
CPC ............. G09G 3/3258; G09G 3/3233; G09G 2310/0278; G09G 2300/0866; H01L 29/78648; H01L 27/3276; H01L 27/1255; H01L 27/3258
See application file for complete search history.

(56) References Cited

U.S. PATENT DOCUMENTS

| | | |
|---|---|---|
| 2006/0061526 A1 | 3/2006 | Shirasaki et al. |
| 2011/0148937 A1 | 6/2011 | Park et al. |
| 2011/0316892 A1* | 12/2011 | Sung .................... G09G 3/3233 345/690 |

(Continued)

FOREIGN PATENT DOCUMENTS

| | | |
|---|---|---|
| KR | 10-2006-0051459 A | 5/2006 |
| KR | 10-2011-0069397 A | 6/2011 |

(Continued)

OTHER PUBLICATIONS

Tai et al., "Three-Transistor AMOLED Pixel Circuit With Threshold Voltage Compensation Function Using Dual-Gate IGZO TFT," *IEEE Electron Device Letters*, vol. 33, No. 3, Mar. 2012, pp. 393-395.

(Continued)

*Primary Examiner* — Abbas Abdulselam
(74) *Attorney, Agent, or Firm* — Knobbe Martens Olson & Bear LLP

(57) ABSTRACT

A pixel, a display device having the same, and a thin film transistor (TFT) substrate for the display device are disclosed. In one aspect, the pixel includes an emitter configured to emit light based at least in part on a driving current. The pixel also includes a driving transistor including an active layer, a first electrode electrically connected to a first end portion of the active layer, a second electrode electrically connected to a second end portion of the active layer, a first gate electrode configured to receive a data voltage from a data driver so as to form a channel in the active layer, and a second gate electrode configured to receive a bias voltage from a voltage source, wherein the channel is configured to adjust the driving current.

20 Claims, 9 Drawing Sheets

(56) References Cited

U.S. PATENT DOCUMENTS

2012/0001893 A1 1/2012 Jeong et al.
2013/0157399 A1 6/2013 Park et al.
2014/0152719 A1* 6/2014 Jung .................... G09G 3/3233
345/691

FOREIGN PATENT DOCUMENTS

KR 10-2012-0002070 A 1/2012
KR 10-2012-0004786 A 1/2012

OTHER PUBLICATIONS

Wang et al., "Asynchronous Double-gate Polycrystalline Silicon Thin-film Transistors for AM-OLED Pixel Circuits," *Institute of Microelectronics*, Peking University Beijing, China, 100871, 978-1-4673-2475-5/12 © 2012, 3 pages.

* cited by examiner

PIXEL, DISPLAY DEVICE HAVING THE SAME, AND THIN FILM TRANSISTOR (TFT) SUBSTRATE FOR DISPLAY DEVICE

INCORPORATION BY REFERENCE TO ANY PRIORITY APPLICATIONS

This application claims priority under 35 U.S.C. §119 to Korean patent Application No. 10-2014-0138080 filed on Oct. 14, 2014, the disclosure of which is hereby incorporated by reference herein in its entirety.

BACKGROUND

1. Field

The described technology generally relates to a pixel, a display device having the pixel, and a thin film transistor (TFT) substrate for the display device.

2. Description of the Related Technology

Since a self-emissive display generates an image using a self-emissive diode, the display does not need a back light unit like a liquid crystal display. Therefore, the self-emissive display has a thin profile and is lightweight.

Furthermore, an organic light-emitting diode (OLED) display, a type of self-emissive display, has favorable characteristics such as low power consumption. Each pixel included in the OLED display includes an OLED and a pixel circuit for controlling a driving current flowing through the OLED. The pixel circuit includes a driving transistor for adjusting the driving current.

SUMMARY OF CERTAIN INVENTIVE ASPECTS

One inventive aspect is to decrease a swing width of the driving current without increasing channel length.

Another aspect is a display device that can display a high resolution image by including the driving transistor.

Another aspect is a TFT substrate for the display device having a high pixel density by including the driving transistor.

Another aspect is a pixel that includes an emission part configured to emit light based on a driving current, a driving transistor including an active layer, a first electrode connected to a first end portion of the active layer, a second electrode connected to a second end portion of the active layer, a first gate electrode that receives a data voltage by which a channel is formed in the active layer, and a second gate electrode that receives a bias voltage, the driving current being adjusted as the channel is formed in the active layer, a data voltage holding part configured to maintain a voltage of the first gate electrode of the driving transistor while the emission part emits the light, and a data voltage providing part configured to provide the data voltage to the first gate electrode of the driving transistor in response to a scan signal.

In example embodiments, a swing width of the driving current according to a swing of the data voltage is adjusted based on the bias voltage applied to the second gate electrode of the driving transistor.

In example embodiments, a magnitude of a threshold voltage of the channel is adjusted based on the bias voltage applied to the second gate electrode of the driving transistor.

In example embodiments, the pixel further includes an emission control part configured to control the light emitted by the emission part based on a first emission signal, and an initialization voltage providing part configured to provide an initialization voltage for initializing the emission part to the emission part.

In example embodiments, the data voltage providing part provides a compensated data voltage that is generated by compensating the data voltage by a threshold voltage of the driving transistor to the first gate electrode of the driving transistor.

In example embodiments, the data voltage providing part includes the driving transistor.

In example embodiments, the data voltage holding part includes a first storage capacitor connected between a first power voltage and the first gate electrode of the driving transistor, and a second storage capacitor connected between the bias voltage and the first gate electrode of the driving transistor. The emission part can include an OLED including a first electrode and a second electrode that receives a second power voltage. The initialization voltage providing part can include a first initialization transistor including a first electrode that receives the initialization voltage, a second electrode connected to the first gate electrode of the driving transistor, and a gate electrode that receives a data initialization signal, and a second initialization transistor including a first electrode that receives the initialization voltage, a second electrode connected to the first electrode of the OLED, and a gate electrode that receives a diode initialization signal. The emission control part can include an emission control transistor including a first electrode connected to the second electrode of the driving transistor, a second electrode connected to the first electrode of the OLED, and a gate electrode that receives the first emission signal. The data voltage providing part can include the driving transistor, a power control transistor including a first electrode that receives the first power voltage, a second electrode connected to the first electrode of the driving transistor, and a gate electrode that receives the first emission signal, a data providing transistor including a first electrode that receives the data voltage, a second electrode connected to the first electrode of the driving transistor, and a gate electrode that receives the scan signal, and a connection transistor including a first electrode connected to the second electrode of the driving transistor, a second electrode connected to the first gate electrode of the driving transistor, and a gate electrode that receives the scan signal.

In example embodiments, the first initialization transistor provides the initialization voltage to the driving transistor while the data initialization signal is activated. The second initialization transistor can provide the initialization voltage to the OLED while the diode initialization signal is activated. The emission control transistor electrically can connect the driving transistor to the emission part while the first emission signal is activated, and electrically disconnect the driving transistor from the emission part while the first emission signal is deactivated, The power control transistor can electrically connect the first power voltage to the driving transistor while the first emission signal is activated, and electrically disconnect the first power voltage from the driving transistor while the first emission signal is deactivated. The data providing transistor can provide the data voltage to the first electrode of the driving transistor while the scan signal is activated. The connection transistor can connect the first gate electrode of the driving transistor to the second electrode of the driving transistor while the scan signal is activated. The driving transistor can provide a compensated data voltage that is generated by compensating the data voltage by a threshold voltage of the driving transistor based on a diode connection formed by the connection transistor to the first gate electrode while the scan signal is activated, and adjusts the driving current based on the compensated data voltage while the first emission signal is activated.

In example embodiments, the pixel further includes a source voltage holding capacitor connected between a first power voltage and the first electrode of the driving transistor, and a power control transistor including a first electrode that receives the first power voltage, a second electrode connected to the first electrode of the driving transistor, and a gate electrode that receives the second emission signal. The data voltage holding part can include a storage capacitor connected between the first electrode of the driving transistor and the first gate electrode of the driving transistor. The emission part can include an OLED including a first electrode and a second electrode that receives a second power voltage. The initialization voltage providing part can include an initialization transistor including a first electrode that receives the initialization voltage, a second electrode connected to the first electrode of the OLED, and a gate electrode that receives the scan signal. The emission control part can include an emission control transistor including a first electrode connected to the second electrode of the driving transistor, a second electrode connected to the first electrode of the OLED, and a gate electrode that receives the first emission signal. The data voltage providing part can include a data providing transistor including a first electrode that receives the data voltage, a second electrode connected to the first gate electrode of the driving transistor, and a gate electrode that receives the scan signal.

In example embodiments, the data voltage holding part includes a first storage capacitor connected between a first power voltage and the first gate electrode of the driving transistor, and a second storage capacitor connected between the bias voltage and the first gate electrode of the driving transistor. The emission part can include an OLED including a first electrode connected to the second electrode of the driving transistor and a second electrode that receives a second power voltage. The data voltage providing part can include a data providing transistor including a first electrode that receives the data voltage, a second electrode connected to the first gate electrode of the driving transistor, and a gate electrode that receives the scan signal.

According to some example embodiments, a display device includes a display panel including a pixel, a scan driver configured to provide a scan signal to the display panel, a data driver configured to provide a data voltage to the display panel, and a timing controller configured to control the scan driver and the data driver. The pixel can include an emission part configured to emit light based on a driving current, a driving transistor including an active layer, a first electrode connected to a first end portion of the active layer, a second electrode connected to a second end portion of the active layer, a first gate electrode that receives the data voltage by which a channel is formed in the active layer, and a second gate electrode that receives a bias voltage, the driving current being adjusted as the channel is formed in the active layer, a data voltage holding part configured to maintain a voltage of the first gate electrode of the driving transistor while the emission part emits the light, and a data voltage providing part configured to provide the data voltage to the first gate electrode of the driving transistor in response to the scan signal.

In example embodiments, a swing width of the driving current according to a swing of the data voltage is adjusted based on the bias voltage applied to the second gate electrode of the driving transistor.

In example embodiments, a magnitude of a threshold voltage of the channel is adjusted based on the bias voltage applied to the second gate electrode of the driving transistor.

According to some example embodiments, a thin film transistor (TFT) substrate for a display device includes a substrate, a bottom gate pattern formed on the substrate, a first gate insulation layer formed on the substrate, the first gate insulation layer covering the bottom gate pattern, an active pattern formed on the first gate insulation layer, the active pattern including a first region and a second region, a second gate insulation layer formed on the first gate insulation layer, the second gate insulation layer covering the active pattern, and a first top gate pattern formed on the second gate insulation layer, the first top gate pattern forming a driving transistor having a double gate structure with the first region, the second region, and the first gate insulation layer. The driving transistor can generate a driving current that is provided to an emission part.

In example embodiments, the bottom gate pattern receives a bias voltage, and the first top gate pattern receives a data voltage.

In example embodiments, a swing width of the driving current according to a swing of the data voltage is adjusted based on the bias voltage applied to the bottom gate pattern of the driving transistor.

In example embodiments, a magnitude of a threshold voltage of the driving transistor can be adjusted based on the bias voltage applied to the bottom gate pattern of the driving transistor.

In example embodiments, the active pattern can include third through fourteenth regions.

In example embodiments, the TFT substrate can further include a second top gate pattern formed on the second gate insulation layer, the second top gate pattern forming a data providing transistor with the third region and the fourth region, the second top gate pattern forming a connection transistor with the fifth region and the sixth region, a third top gate pattern formed on the second gate insulation layer, the third top gate pattern forming a first initialization transistor with the seventh region and the eighth region, a fourth top gate pattern formed on the second gate insulation layer, the fourth top gate pattern forming a power control transistor with the ninth region and the tenth region, the fourth top gate pattern forming an emission control transistor with the eleventh region and the twelfth region, and a fifth top gate pattern formed on the second gate insulation layer, the fifth top gate pattern forming a second initialization transistor with the thirteenth region and the fourteenth region.

In example embodiments, the TFT substrate can further include an insulation interlayer formed on the second gate insulation layer, the insulation interlayer covering the first through fifth top gate patterns, and a capacitor pattern formed on the insulation interlayer, the capacitor pattern forming a storage capacitor with the first top gate pattern.

Another aspect is a pixel comprising an emitter configured to emit light based at least in part on a driving current. The pixel also comprises a driving transistor including an active layer, a first electrode electrically connected to a first end portion of the active layer, a second electrode electrically connected to a second end portion of the active layer, a first gate electrode configured to receive a data voltage from a data driver so as to form a channel in the active layer, and a second gate electrode configured to receive a bias voltage from a voltage source, wherein the channel is configured to adjust the driving current. The pixel also comprises a data voltage holding circuit configured to maintain a voltage of the first gate electrode while the emitter emits the light. The pixel further comprises a data voltage providing circuit configured to transmit the data voltage to the first gate electrode based at least in part on a scan signal.

In the above pixel, the second gate electrode is configured to adjust a swing width of the driving current based on the bias voltage, wherein the swing width corresponds to a swing of the data voltage.

In the above pixel, the second gate electrode is configured to adjust a magnitude of a threshold voltage of the driving transistor based on the bias voltage.

The above further comprises an emission controller configured to control the light emitted by the emitter based at least in part on a first emission signal and an initialization voltage providing circuit configured to transmit an initialization voltage to the emitter so as to initialize the emitter.

In the above pixel, the data voltage providing circuit is further configured to compensate the data voltage with the threshold voltage of the driving transistor so as to transmit a compensated data voltage to the first gate electrode of the driving transistor.

In the above pixel, the data voltage providing circuit includes the driving transistor.

In the above pixel, the data voltage holding circuit includes a first storage capacitor electrically connected between a first power voltage and the first gate electrode of the driving transistor and a second storage capacitor electrically connected between the bias voltage and the first gate electrode of the driving transistor, wherein the emitter includes an organic light-emitting diode (OLED) including a first electrode and a second electrode configured to receive a second power voltage from a second power source. In the above pixel, the initialization voltage providing circuit includes a first initialization transistor including a first electrode configured to receive the initialization voltage from an initialization voltage generator, a second electrode electrically connected to the first gate electrode of the driving transistor, and a gate electrode configured to receive a data initialization signal from a scan driver. In the above pixel, the initialization voltage providing circuit also includes a second initialization transistor including a first electrode configured to receive the initialization voltage from the initialization voltage generator, a second electrode electrically connected to the first electrode of the OLED, and a gate electrode configured to receive a diode initialization signal from the scan driver, wherein the emission controller includes an emission control transistor including a first electrode electrically connected to the second electrode of the driving transistor, a second electrode electrically connected to the first electrode of the OLED, and a gate electrode configured to receive the first emission signal from an emission driver. In the above pixel, the data voltage providing circuit includes the driving transistor. In the above pixel, the data voltage providing circuit also includes a power control transistor including a first electrode configured to receive the first power voltage from a first power source, a second electrode electrically connected to the first electrode of the driving transistor, and a gate electrode configured to receive the first emission signal from the emission driver. In the above pixel, the data voltage providing circuit further includes a data providing transistor including a first electrode configured to receive the data voltage from a data driver, a second electrode electrically connected to the first electrode of the driving transistor, and a gate electrode configured to receive the scan signal from the scan driver. In the above pixel, the data voltage providing circuit further includes a connection transistor including a first electrode electrically connected to the second electrode of the driving transistor, a second electrode electrically connected to the first gate electrode of the driving transistor, and a gate electrode configured to receive the scan signal from the scan driver.

In the above pixel, the first initialization transistor is further configured to transmit the initialization voltage to the driving transistor while the data initialization signal is activated, wherein the second initialization transistor is further configured to provide the initialization voltage to the OLED while the diode initialization signal is activated, wherein the emission control transistor is configured to i) electrically connect the driving transistor to the emitter while the first emission signal is activated and ii) electrically disconnect the driving transistor from the emitter while the first emission signal is deactivated, wherein the power control transistor is configured to i) electrically connect the first power voltage to the driving transistor while the first emission signal is activated and ii) electrically disconnect the first power voltage from the driving transistor while the first emission signal is deactivated, wherein the data providing transistor is configured to transmit the data voltage to the first electrode of the driving transistor while the scan signal is activated, wherein the connection transistor is configured to electrically connect the first gate electrode of the driving transistor to the second electrode of the driving transistor while the scan signal is activated so as to form a diode connection, and wherein the driving transistor is configured to i) transmit the compensated data voltage based at least in part on the diode connection to the first gate electrode while the scan signal is activated, and ii) adjust the driving current based at least in part on the compensated data voltage while the first emission signal is activated.

The above pixel further comprises a source voltage holding capacitor electrically connected between a first power voltage and the first electrode of the driving transistor. The above pixel also comprises a power control transistor including a first electrode configured to receive the first power voltage, a second electrode electrically connected to the first electrode of the driving transistor, and a gate electrode configured to receive the second emission signal from an emission driver, wherein the data voltage holding circuit includes a storage capacitor electrically connected between the first electrode and the first gate electrode of the driving transistor, wherein the emitter includes an organic light-emitting diode (OLED) including a first electrode and a second electrode configured to receive a second power voltage from a second power source, wherein the initialization voltage providing circuit includes an initialization transistor including a first electrode configured to receive the initialization voltage, a second electrode electrically connected to the first electrode of the OLED, and a gate electrode configured to receive the scan signal from a scan driver, wherein the emission controller includes an emission control transistor including a first electrode electrically connected to the second electrode of the driving transistor, a second electrode electrically connected to the first electrode of the OLED, and a gate electrode configured to receive the first emission signal from the emission driver, and wherein the data voltage providing circuit includes a data providing transistor including a first electrode configured to receive the data voltage from a data driver, a second electrode electrically connected to the first gate electrode of the driving transistor, and a gate electrode configured to receive the scan signal from the scan driver.

In the above pixel, the data voltage holding circuit includes a first storage capacitor electrically connected between a first power voltage and the first gate electrode of the driving transistor and a second storage capacitor electrically connected between the bias voltage and the first gate electrode of the driving transistor, wherein the emitter includes an organic light-emitting diode (OLED) including i) a first electrode electrically connected to the second electrode of the driving transistor and ii) a second electrode configured to receive a second power voltage from a second power source, and wherein the data voltage providing part includes a data providing transistor including a first electrode configured to receive the data voltage, a second electrode electrically connected to the first gate electrode of the driving transistor, and a gate electrode configured to receive the scan signal from a scan driver.

Another aspect is a display device comprising a display panel including a pixel, a scan driver configured to provide a scan signal to the display panel, a data driver configured to provide a data voltage to the display panel, and a timing controller configured to control the scan driver and the data driver. The pixel includes an emitter configured to emit light based at least in part on a driving current. The pixel also includes a driving transistor including an active layer, a first electrode electrically connected to a first end portion of the active layer, a second electrode electrically connected to a second end portion of the active layer, a first gate electrode configured to receive a data voltage from a data driver so as to form a channel in the active layer, and a second gate electrode configured to receive a bias voltage from a voltage source, wherein the channel is configured to adjust the driving current. The pixel further includes a data voltage holding circuit configured to maintain a voltage of the first gate electrode while the emitter emits the light. The pixel further includes a data voltage providing circuit configured to transmit the data voltage to the first gate electrode based at least in part on a scan signal.

In the above display device, the second gate electrode is configured to adjust a swing width of the driving current based on the bias voltage, and wherein the swing width corresponds to a swing of the data voltage.

In the above display device, the second gate electrode is configured to adjust a magnitude of a threshold voltage of the driving transistor based on the bias voltage.

Another aspect is a thin film transistor (TFT) substrate for a display device, the TFT substrate comprising a substrate, a bottom gate pattern formed over the substrate, a first gate insulation layer formed over the substrate and covering the bottom gate pattern, an active pattern formed over the first gate insulation layer and including a first region and a second region, a second gate insulation layer formed over the first gate insulation layer and covering the active pattern, and a first top gate pattern formed over the second gate insulation layer so as to form a driving transistor having a double gate structure including the first region, the second region, and the first gate insulation layer, wherein the driving transistor is configured to generate a driving current.

In the above TFT substrate, the bottom gate pattern is configured to receive a bias voltage from a voltage source, and wherein the first top gate pattern is configured to receive a data voltage from a data driver.

In the above TFT substrate, the second gate electrode is configured to adjust a swing width of the driving current based on the bias voltage, and wherein the swing width corresponds to a swing of the data voltage.

In the above TFT substrate, the second gate electrode is configured to adjust a magnitude of a threshold voltage of the driving transistor based on the bias voltage.

In the above TFT substrate, the active pattern includes third through fourteenth regions.

The above TFT further comprises a second top gate pattern formed over the second gate insulation layer so as to form i) a data providing transistor with the third region and the fourth region and ii) a connection transistor with the fifth region and the sixth region. The above TFT further comprises a third top gate pattern formed over the second gate insulation layer so as to form a first initialization transistor with the seventh region and the eighth region. The above TFT further comprises a fourth top gate pattern formed over the second gate insulation layer so as to form i) a power control transistor with the ninth region and the tenth region and ii) an emission control transistor with the eleventh region and the twelfth region. The above TFT further comprises a fifth top gate pattern formed over the second gate insulation layer so as to form a second initialization transistor with the thirteenth region and the fourteenth region.

The above TFT further comprises an insulation interlayer formed over the second gate insulation layer and covering the first through fifth top gate patterns. The above TFT further comprises a capacitor pattern formed over the insulation interlayer so as to form a storage capacitor with the first top gate pattern.

According to at least one of the disclosed embodiments, a pixel includes a driving transistor having a double gate structure. A second gate electrode of the driving transistor receives a bias voltage. Because a swing width of a driving current according to a swing of the data voltage is adjusted based on the bias voltage, the pixel reduces a luminance variation of emission parts.

A display device according to example embodiments displays a high resolution image by including the driving transistor of the pixel.

In addition, a TFT substrate for the display device according to example embodiments has a high pixel density by including the driving transistor.

DETAILED DESCRIPTION OF CERTAIN INVENTIVE EMBODIMENTS

The amount of driving current generated by pixel circuits can differ from each other due to variations in the semiconductor fabrication process or electrothermal effects during use. Because OLED displays emit light based on the driving current, they do not have uniform luminescence across all pixels, and stains can be generated.

Since data voltages that are applied to a gate electrode of the driving transistor can swing, the driving current can also be unsteady. The driving transistor can adjust the driving current more uniformly when the swing width of the data voltage is relatively small. However, when the channel length of the driving transistor is increased to reduce the swing width of the driving current, the size of the driving transistor will increase.

Exemplary embodiments will be described more fully hereinafter with reference to the accompanying drawings, in which various embodiments are shown. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
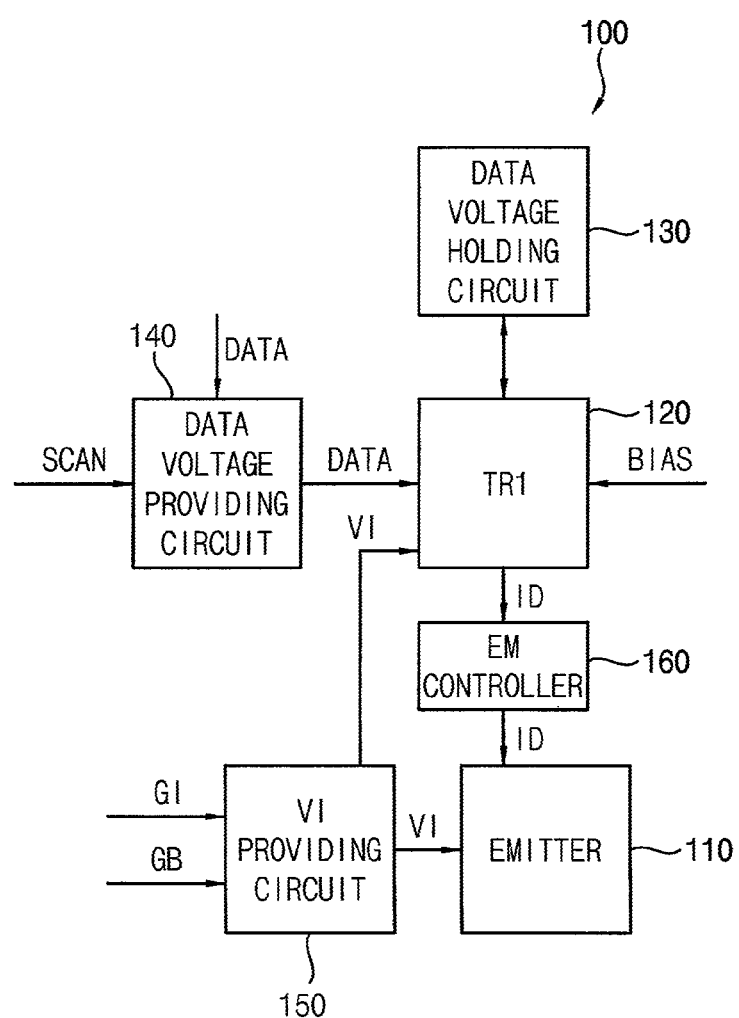
FIG. 1 is a block diagram illustrating a pixel according to example embodiments.
Figure 2:
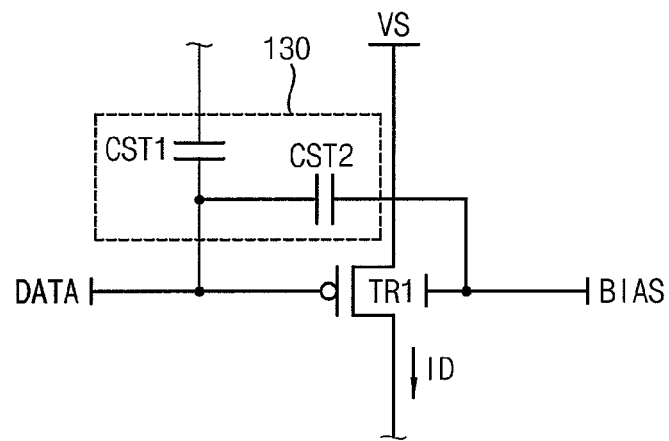
FIG. 2 is a circuit diagram illustrating an example of a driving transistor and a data voltage holding part included in the pixel of FIG. 1.

FIG. 1 is a block diagram illustrating a pixel according to example embodiments. FIG. 2 is a circuit diagram illustrating an example of a driving transistor and a data voltage holding part included in the pixel of FIG. 1.

Referring to FIGS. 1 and 2, the pixel 100 includes an emission part or emitter 110, a driving transistor 120, a data voltage holding part or data voltage holding circuit 130, and a data voltage providing part or data voltage providing circuit 140. In some embodiments, the pixel 100 further includes an initialization voltage providing part or initialization voltage providing circuit 150 and an emission control part or emission controller 160.

The emission part 110 can emit light based on a driving current ID. The emission part 110 can include an OLED. Also, the emission part 110 can further include a diode parallel capacitor connected in parallel with the OLED. In some embodiments, the diode parallel capacitor is connected between both electrodes of the OLED and is a parasitic capacitor.

The driving transistor 120 can include an active layer, a first electrode, a second electrode, a first gate electrode, and a second gate electrode. The first electrode can be connected to a first end portion of the active layer. The second electrode can be connected to a second end portion of the active layer. The first gate electrode can receive a data voltage DATA by which a channel is formed in the active layer such that the driving current ID is adjusted. The second gate electrode can receive a bias voltage BIAS. In some embodiments, a swing width of the driving current ID according to a swing of the data voltage DATA is adjusted based on the bias voltage BIAS applied to the second gate electrode of the driving transistor 120. In some embodiments, a magnitude of a threshold voltage of the driving transistor is adjusted based on the bias voltage BIAS applied to the second gate electrode of the driving transistor 120. An example of adjusting the swing width of the driving current ID according to the swing of the data voltage DATA will be described in detail with reference to the FIG. 3.

The data voltage holding part 130 can substantially maintain a voltage of the first gate electrode of the driving transistor 120 while the emission part 110 emits light. In some embodiments, the data voltage holding part 130 can include a first storage capacitor CST1. In some embodiments, the data voltage holding part 130 further includes a second storage capacitor CST2. The second storage capacitor CST2 can maintain the voltage of the first gate electrode of the driving transistor 120 with the first storage capacitor CST1, thereby reducing the size of the data voltage holding part 130.

The data voltage holding part 130 can maintain the data voltage DATA applied to the first gate electrode of the driving transistor 120 and an initialization voltage VI for a predetermined period.

The data voltage providing part 140 can provide the data voltage DATA to the first gate electrode of the driving transistor 120 in response to a scan signal SCAN. In some embodiments, the data voltage providing part 140 provides a compensated data voltage that is generated by compensating the data voltage DATA by a threshold voltage of the driving transistor 120 to the driving transistor 120. In some embodiments, the data voltage providing part 140 includes the driving transistor 120.

The initialization voltage providing part 150 can provide the initialization voltage VI for initializing the emission part 110 to the emission part 110. In this case, the initialization voltage providing part 150 can provide the initialization voltage VI to the emission part 110 based on a diode initialization signal GB. In some embodiments, the initialization voltage providing part 150 provides the initialization voltage VI to the driving transistor 120. In this case, the initialization voltage providing part 150 can provide the initialization voltage VI to the driving transistor 120 based on an initialization signal GI. The initialization voltage VI can be generated by an initialization voltage generator (not shown).

The emission control part 160 can control the light emitted by the emission part 110 based on a first emission signal. For example, the emission control part 160 electrically connects the driving transistor 120 to the emission part 110 while the first emission signal is activated, and electrically disconnects the driving transistor 120 from the emission part 110 while the first emission signal is deactivated.

As a result, the swing width of the driving current ID according to a swing of the data voltage is adjusted based on the bias voltage BIAS applied to the second gate electrode of the driving transistor 120, thereby reducing a luminance variation of emission part 110.

Figure 3:
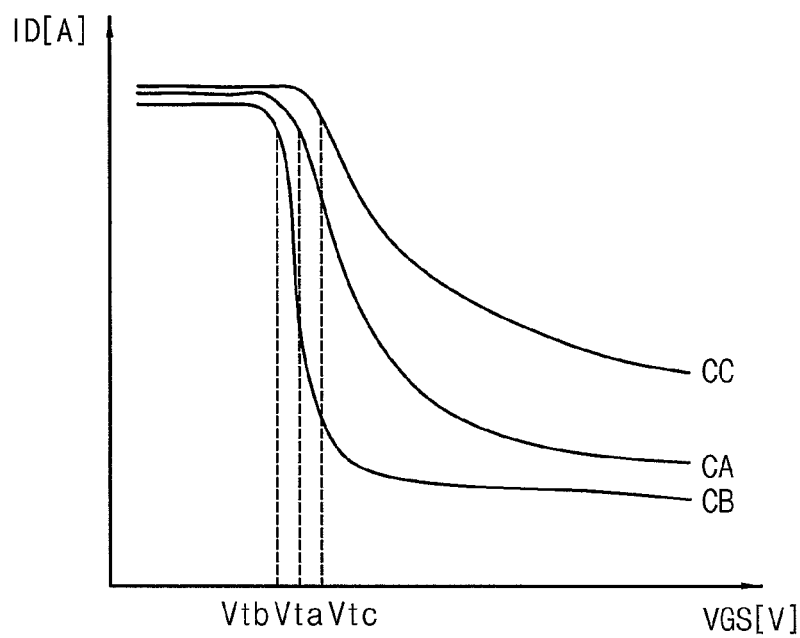
FIG. 3 is a graph illustrating electrical characteristics of a driving transistor included in the pixel of FIG. 1.

FIG. 3 is a graph illustrating electrical characteristics of a driving transistor included in the pixel of FIG. 1.

Referring to FIG. 3, bias voltages that are different from each other are applied to a second gate electrode of a driving transistor included in the pixel of FIG. 1.

If a bias voltage is not applied to the second gate electrode CA, a driving current ID can be changed when a voltage difference between gate and source electrodes VGS of the driving transistor reaches a first threshold voltage Vta. In addition, the driving current ID can be decreased as the voltage difference between gate and source electrodes VGS of the driving transistor is increased more than the first threshold voltage Vta.

If a bias voltage having a relatively low level is applied to the second gate electrode CB, the driving current ID can be changed when a voltage difference between gate and source electrodes VGS of the driving transistor reaches a second threshold voltage Vtb lower than the first threshold voltage Vta. In this case, the amount of the driving current ID can be decreased more rapidly compared to the case where the bias voltage is not applied to the second gate electrode CA.

If a bias voltage having relatively high level is applied to the second gate electrode CC, the driving current ID can be changed when a voltage difference between gate and source electrodes VGS of the driving transistor reaches a third threshold voltage Vtc greater than the first threshold voltage Vta. In this case, the amount of the driving current ID can be decreased more slowly compared to the case where the bias voltage is not applied to the second gate electrode CA.

As a result, an electrical characteristic of the driving transistor can be adjusted by the bias voltage applied to the second gate electrode. Therefore, the bias voltage is relatively high to reduce the swing width of the driving current ID.

Figure 4:
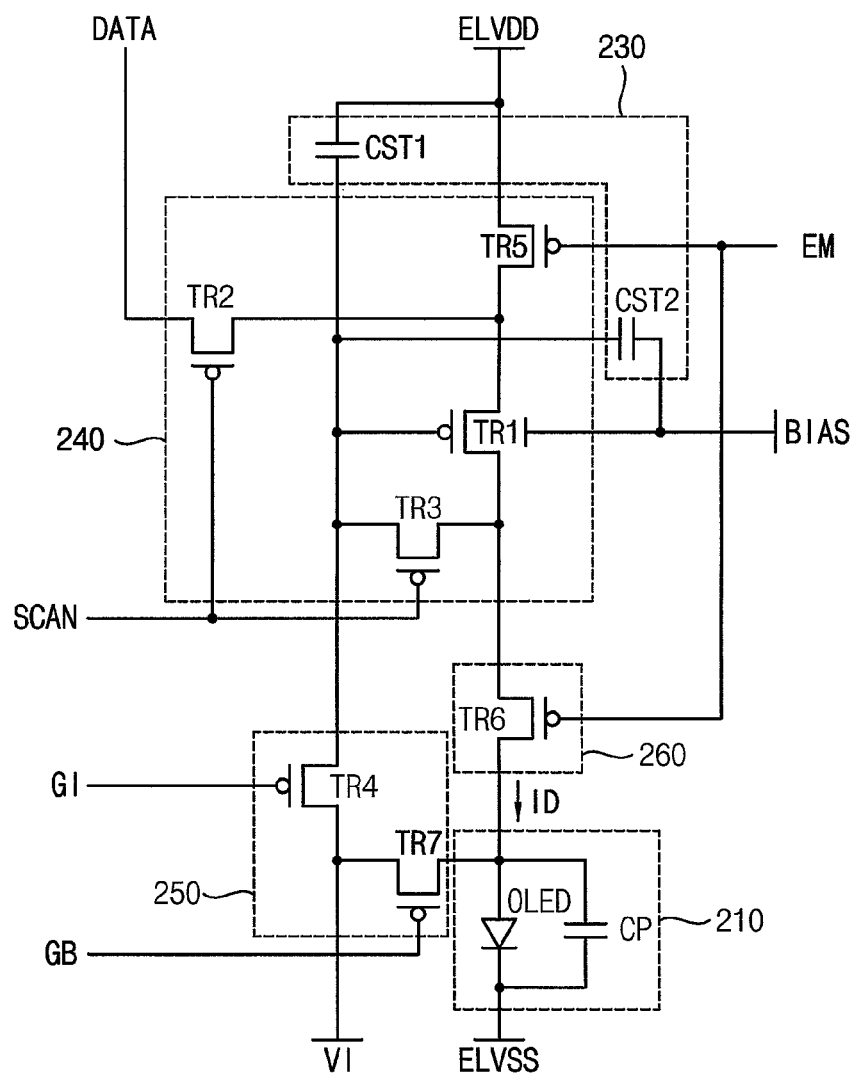
FIG. 4 is a circuit diagram illustrating one example of the pixel of FIG. 1.

FIG. 4 is a circuit diagram illustrating one example of the pixel of FIG. 1.

Referring to FIG. 4, the pixel 200 includes an emission part or emitter 210, a driving transistor TR1, a data voltage holding part or data voltage holding circuit 230, a data voltage providing part or data voltage providing circuit 240, an initialization voltage providing part or initialization voltage providing circuit 250, and an emission control part or emission controller 260. Here, the data voltage providing part 240 can include the driving transistor TR1

The emission part 210 can include an OLED. Also, the emission part 210 can further include a diode parallel capacitor CP connected in parallel with the OLED. The OLED can include a first electrode and a second electrode. The second electrode can receive a second power voltage ELVSS.

The data voltage holding part 230 can include a first storage capacitor CST1 and a second storage capacitor CST2. The first storage capacitor CST1 and the second storage capacitor CST2 can maintain the voltage of the first gate electrode of the driving transistor TR1 while the emission part 210 emits the light.

The data voltage providing part 240 can include a driving transistor TR1, a power control transistor TR5, a data providing transistor TR2, and a connection transistor TR3. In some embodiments, the data voltage providing part 240 provides a compensated data voltage that is generated by compensating the data voltage DATA by a threshold voltage of the driving transistor TR1 to the first gate electrode of the driving transistor TR1.

The data providing transistor TR2 can include a first electrode, a second electrode, and a gate electrode. The first electrode can receive the data voltage DATA. The second electrode can be connected to the first electrode of the driving transistor TR1. The gate electrode can receive the scan signal SCAN. The data providing transistor TR2 can provide the data voltage DATA to the first electrode of the driving transistor TR1 while the scan signal SCAN is activated.

The power control transistor TR5 can include a first electrode, a second electrode, and a gate electrode. The first electrode can receive the first power voltage ELVDD. The second electrode can be connected to the first electrode of the driving transistor TR1. The gate electrode can receive the first emission signal EM. The power control transistor TR5 can electrically connect the first power voltage ELVDD to the driving transistor TR1 while the first emission signal EM is activated, and can electrically disconnect the first power voltage ELVDD from the driving transistor TR1 while the first emission signal EM is deactivated.

The connection transistor TR3 can include a first electrode, a second electrode, and a gate electrode. The first electrode can be connected to the second electrode of the driving transistor TR1. The second electrode can be connected to the first gate electrode of the driving transistor TR1. The gate electrode can receive the scan signal SCAN. The connection transistor TR3 can connect the first gate electrode of the driving transistor TR1 to the second electrode of the driving transistor TR1 while the scan signal SCAN is activated, thereby forming a diode connection of the driving transistor TR1.

The driving transistor TR1 can include an active layer, a first electrode, a second electrode, a first gate electrode, and a second gate electrode. The second gate electrode can receive the bias voltage BIAS. The driving transistor TR1 can provide the compensated data voltage that is generated by compensating the data voltage DATA by a threshold voltage of the driving transistor TR1 based on a diode connection formed by the connection transistor TR3 to the first gate electrode while the scan signal SCAN is activated. As a result, the driving transistor TR1 can adjust the driving current ID based on the compensated data voltage while the first emission signal EM is activated.

The initialization voltage providing part 250 can include a first initialization transistor TR4 and a second initialization transistor TR7.

The first initialization transistor TR4 can include a first electrode, a second electrode, and a gate electrode. The first electrode can receive the initialization voltage VI. The second electrode can be connected to the first gate electrode of the driving transistor TR1. The gate electrode can receive a data initialization signal GI. The first initialization transistor TR4 can provide the initialization voltage VI to the driving transistor TR1 while the data initialization signal GI is activated. The initialization voltage VI can be generated by an initialization voltage generator (not shown).

The second initialization transistor TR7 can include a first electrode, a second electrode, and a gate electrode. The first electrode can receive the initialization voltage VI. The second electrode can be connected to the first electrode of the OLED. The gate electrode can receive a diode initialization signal GB. The second initialization transistor TR7 can provide the initialization voltage VI to the OLED while the diode initialization signal GB is activated.

The emission control part 260 can include an emission control transistor TR6. The emission control transistor TR6 can include a first electrode, a second electrode, and a gate electrode. The first electrode can be connected to the second electrode of the driving transistor TR1. The second electrode connected to the first electrode of the OLED. The gate electrode can receive the first emission signal EM. The emission control transistor TR6 can electrically connect the driving transistor TR1 to the emission part 210 while the first emission signal EM is activated, and can electrically disconnect the driving transistor TR1 from the emission part 210 while the first emission signal EM is deactivated.

As a result, the swing width of the driving current ID according to a swing of the data voltage DATA is adjusted based on the bias voltage BIAS applied to the second gate electrode of the driving transistor TR1, thereby reducing a luminance variation of emission part 210.

Figure 5:
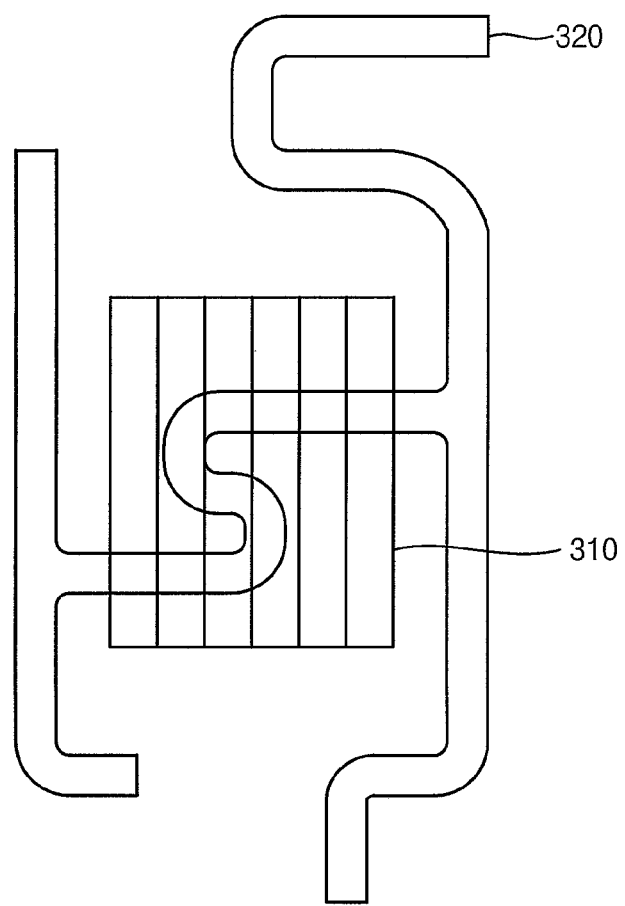
FIGS. 5 through 7 are diagrams illustrating a TFT substrate for a display device including the pixel of FIG. 4.
Figure 6:
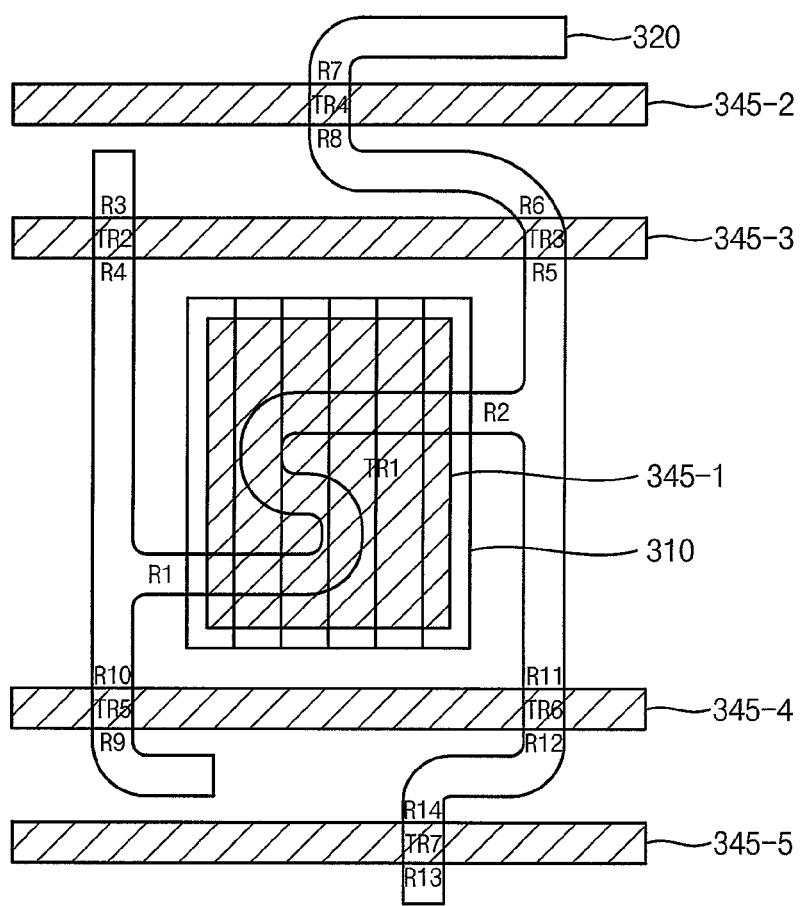
Figure 7:
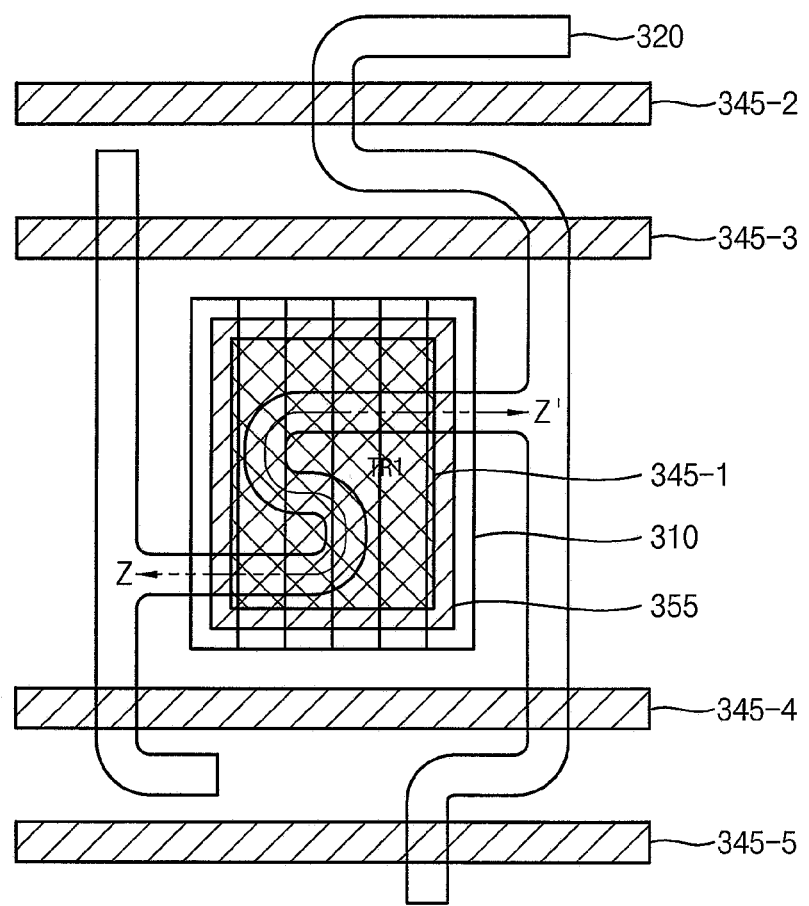
Figure 8:
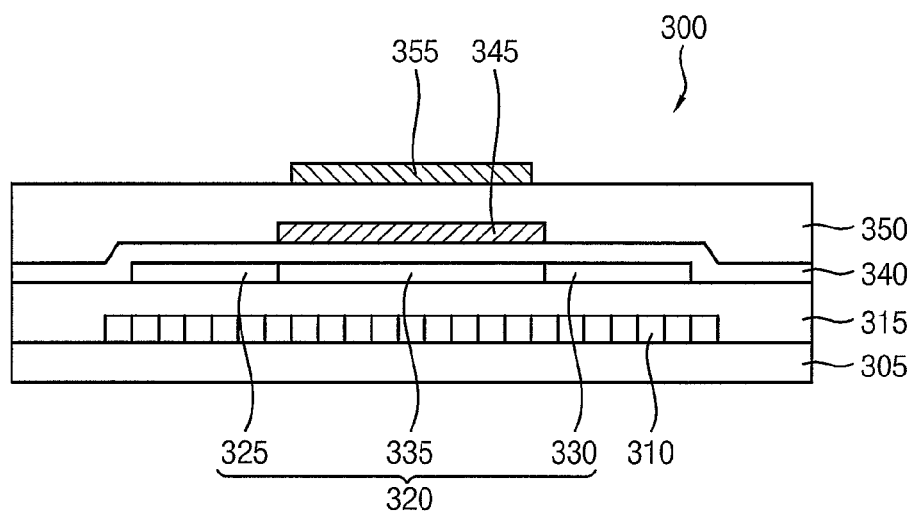
FIG. 8 is a cross-sectional view illustrating an example of a view taken along the line Z-Z' of FIG. 7.

FIGS. 5 through 7 are diagrams illustrating a thin film transistor (TFT) substrate for a display device including the pixel of FIG. 4. FIG. 8 is a cross-sectional view illustrating an example of a view taken along the line Z-Z' of FIG. 7.

Referring to FIGS. 5 and 8, a TFT substrate 300 for a display device includes a substrate 305, a bottom gate pattern 310, a first gate insulation layer 315, and an active pattern 320.

The substrate 305 can be formed of an insulation material. For example, the substrate 305 includes at least one of a glass substrate, a transparent plastic substrate, a transparent metal oxide substrate, etc. Also, a buffer layer can be formed on the substrate 305. For example, the buffer layer is formed of a silicon oxide (SiOx), silicon nitride (SiNx), silicon oxide nitride (SiOxNy), etc.

The bottom gate pattern 310 can be formed on the substrate 305. The bottom gate pattern 310 can be formed of at least one of metal, alloy, conductive metal oxide, transparent conductive material, etc. For example, the bottom gate pattern 310 is formed of aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These materials can be used alone or in a combination thereof. In some embodiments, the bottom gate pattern 310 receives the bias voltage BIAS of FIG. 4.

The bottom gate pattern 310 can overlap a first top gate pattern 345-1. Therefore, the bottom gate pattern 310 can form the second storage capacitor CST2 of FIG. 4 with the first top gate pattern 345-1.

The first gate insulation layer 315 can be formed on the substrate 305. The first gate insulation layer 315 can cover the bottom gate pattern 310 (see FIG. 8). In some embodiments, the first gate insulation layer 315 covers the bottom gate pattern 310, thereby forming a substantially flat surface without a step difference. The first gate insulation layer 315 can be formed of at least one of a silicon compound, metal oxide, etc. For example, the first gate insulation layer 315 is formed of silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These can be used alone or in a combination thereof. In addition, the first gate insulation layer 315 can have a single layer structure or a multi layer structure formed of the silicon oxide and/or the silicon nitride.

The active pattern 320 can be formed on the first gate insulation layer 315. The active pattern 320 can include silicon (Si). In another example embodiment, the active pattern 320 can be formed of at least one of a semiconductor oxide containing a binary compound (ABx), a ternary compound (ABxCy) and/or a quaternary compound (ABxCyDz). For example, the active pattern 320 is formed of indium (In), zinc (Zn), gallium (Ga), stannum (Sn), titanium (Ti), aluminum (Al), hafnium (Hf), zirconium (Zr) and/or magnesium (Mg). These can be used alone or in a combination thereof.

Referring to FIGS. 6 and 8, the TFT substrate 300 includes a substrate 305, a bottom gate pattern 310, a first gate insulation layer 315, and an active pattern 320, a second gate insulation layer 340, a first top gate pattern 345-1, a second top gate pattern 345-2, a third top gate pattern 345-3, a fourth top gate pattern 345-4, and a fifth top gate pattern 345-5.

The active pattern 320 can include first through fourteenth regions R1 through R14. The first through fourteenth regions R1 through R14 can be doping regions 325 or 330 doped by an impurity such that the first through fourteenth regions R1 through R14 have a greater electrical conductivity than other region 335 of the active pattern 320. The first through fourteenth regions R1 through R14 can be used to form source or drain electrodes of first through seventh transistors TR1 through TR7. In some embodiments, the boundaries of the first through fourteenth regions R1 through R14 are not clearly divided and can be electrically connected to each other. For example, in FIG. 6, the second region R2 is electrically connected to the fifth region R5 and the eleventh region R11 without distinct boundaries.

The second gate insulation layer 340 can be formed on the first gate insulation layer 315. The second gate insulation layer 340 can cover the active pattern 320 (see FIG. 8). In some embodiments, the second gate insulation layer 340 covers the active pattern 320, thereby forming a substantially flat surface without a step difference.

The first through fifth top gate patterns 345-1 through 345-5 can be formed on the second gate insulation layer 340. Each of the first through fifth top gate patterns 345-1 through 345-5 can be formed of at least one of metal, alloy, conductive metal oxide, transparent conductive material, etc. For example, the first through fifth top gate patterns 345-1 through 345-5 are formed of aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These can be used alone or in a combination thereof.

The first top gate pattern 345-1 can form a driving transistor TR1 having a double gate structure with the first region R1, the second region R2, and the first gate insulation layer 315. In some embodiments, the first region R1 is a source region and the second region R2 is a drain region. In some embodiments, the first region R1 is a drain region and the second region R2 is a source region. The first region R1 and the second region R2 can be formed by doping an impurity. On the other hand, in some embodiments, a portion of the active pattern 320 located below the first top gate pattern 345-1 does not contain the impurity. The first region R1 and the second region R2 can act as the conductor. The portion of the active pattern 320 located below the first top gate pattern 345-1 can act as the channel. As a result, the first transistor TR1 can adjust the driving current ID.

The second top gate pattern 345-2 can form a data providing transistor TR2 with the third region R3 and the fourth region R4. In some embodiments, the third region R3 is a source region and the fourth region R4 is a drain region. In some embodiments, the third region R3 is a drain region and the fourth region R4 is a source region. In addition, the second top gate pattern 345-2 can form a connection transistor TR3 with the fifth region R5 and the sixth region R6. In some embodiments, the fifth region R5 is a source region and the sixth region R6 is a drain region. In some embodiments, the fifth region R5 is a drain region and the sixth region R6 is a source region. The fourth region R4 can be electrically connected to the first region R1. The fifth region R5 can be electrically connected to the second region R2. The third through sixth regions R3 through R6 can be formed by doping the impurity. On the other hand, in some embodiments, a portion of the active pattern 320 located below the second top gate pattern 345-2 does not contain the impurity. As a result, the third through sixth regions R3 through R6 can act as the conductor. The portion of the active pattern 320 located below the second top gate pattern 345-2 can act as the channel of the data providing transistor TR2 and the connection transistor TR3. In some embodiments, the second top gate pattern 345-2 receives the scan signal SCAN of FIG. 4.

The third top gate pattern 345-3 can form a first initialization transistor TR4 with the seventh region R7 and the eighth region R8. In some embodiments, the seventh region R7 is a source region and the eighth region R8 is a drain region. In some embodiments, the seventh region R7 is a drain region and the eighth region R8 is a source region. The eighth region R8 can be electrically connected to the sixth region R6. The seventh region R7 and the eighth region R8 can be formed by doping the impurity. On the other hand, in some embodiments, a portion of the active pattern 320 located below the third top gate pattern 345-3 does not contain the impurity. As a result, the seventh and eighth regions R7 and R8 can act as the conductor. The portion of the active pattern 320 located below the third top gate pattern 345-3 can act as the channel of the first initialization transistor TR4. In some embodiments, the third top gate pattern 345-3 receives the data initialization signal GI of FIG. 4.

The fourth top gate pattern 345-4 can form a power control transistor TR5 with the ninth region R9 and the tenth region R10. In some embodiments, the ninth region R9 is a source region and the tenth region R10 is a drain region. In some embodiments, the ninth region R9 is a drain region and the tenth region R10 is a source region. In addition, the fourth top gate pattern 345-4 can form an emission control transistor TR6 with the eleventh region R11 and the twelfth region T12. In some embodiments, the eleventh region R11 is a source region and the twelfth region R12 is a drain region. In some embodiments, the eleventh region R11 is a drain region and the twelfth region R12 is a source region. The tenth region R10 can be electrically connected to the first region R1. The eleventh region R11 can be electrically connected to the second region R2. The ninth through twelfth regions R9 through R12 can be formed by doping the impurity. On the other hand, in some embodiments, a portion of the active pattern 320 located below the fourth top gate pattern 345-4 does not contain the impurity. As a result, the ninth through twelfth regions R9 through R12 can act as the conductor. The portion of the active pattern 320 located below the fourth top gate pattern 345-4 can act as the channel of the power control transistor TR5 and the emission control transistor TR6. In some embodiments, the fourth top gate pattern 345-4 receives the first emission signal EM of FIG. 4

The fifth top gate pattern 345-5 can form a second initialization transistor TR7 with the thirteenth region R13 and the fourteenth region R14. In some embodiments, the thirteenth region R13 is a source region and the fourteenth region R14 is a drain region. In some embodiments, the thirteenth region R13 is a drain region and the fourteenth region R14 is a source region. The fourteenth region R14 can be electrically connected to the twelfth region R12. The thirteenth through fourteenth regions R13 and R14 can be formed by doping the impurity. On the other hand, in some embodiments, a portion of the active pattern 320 located below the fifth top gate pattern 345-5 does not contain the impurity. As a result, the thirteenth and fourteenth regions R13 and R14 can act as the conductor. The portion of the active pattern 320 located below the fifth top gate pattern 345-5 can act as the channel of the second initialization transistor TR7. In some embodiments, the fifth top gate pattern 345-5 receives the diode initialization signal GB of FIG. 4. In some embodiments, the seventh and thirteenth regions R7 and R13 receive the initialization voltage VI of FIG. 4.

Referring to FIGS. 7 and 8, the TFT substrate 300 includes a substrate 305, a bottom gate pattern 310, a first gate insulation layer 315, and an active pattern 320, a second gate insulation layer 340, a first top gate pattern 345-1, a second top gate pattern 345-2, a third top gate pattern 345-3, a fourth top gate pattern 345-4, a fifth top gate pattern 345-5, an insulation interlayer 350, and a capacitor pattern 355.

The insulation interlayer 350 can be formed on the second gate insulation layer 340. The insulation interlayer 350 can cover the first through fifth top gate patterns 345-1 through 345-5 (see FIG. 8). In some embodiments, the insulation interlayer 350 covers the first through fifth top gate patterns 345-1 through 345-5, thereby forming a substantially flat surface without a step difference. The insulation interlayer 350 can be formed of an organic material such as silicon compound, or an inorganic material such as transparent insulation resin. For example, the insulation interlayer 350 is formed of at least one of silicon oxide (SiOx), silicon nitride (SiNx), silicon oxynitride (SiOxNy), etc. These can be used alone or in a combination thereof.

The capacitor pattern 355 can be formed on the insulation interlayer 350. The capacitor pattern 355 can overlap the first top gate pattern 345-1. Therefore, the capacitor pattern 355 can form the first storage capacitor CST1 of FIG. 4 with the first top gate pattern 345-1. The capacitor pattern 355 can be formed of at least one of metal, alloy, metal nitride, conductive metal oxide, a transparent conductive material, etc. These can be used alone or in a combination thereof.

As a result, characteristics of the driving transistor TR1 can be enhanced by the bottom gate pattern 310, thereby reducing a channel length of the driving transistor TR1. Further, the bottom gate pattern 310 can additionally form the second storage capacitor to decrease a size of the first storage capacitor, thereby decreasing a size of the pixel and increasing the pixel density.

Figure 9:
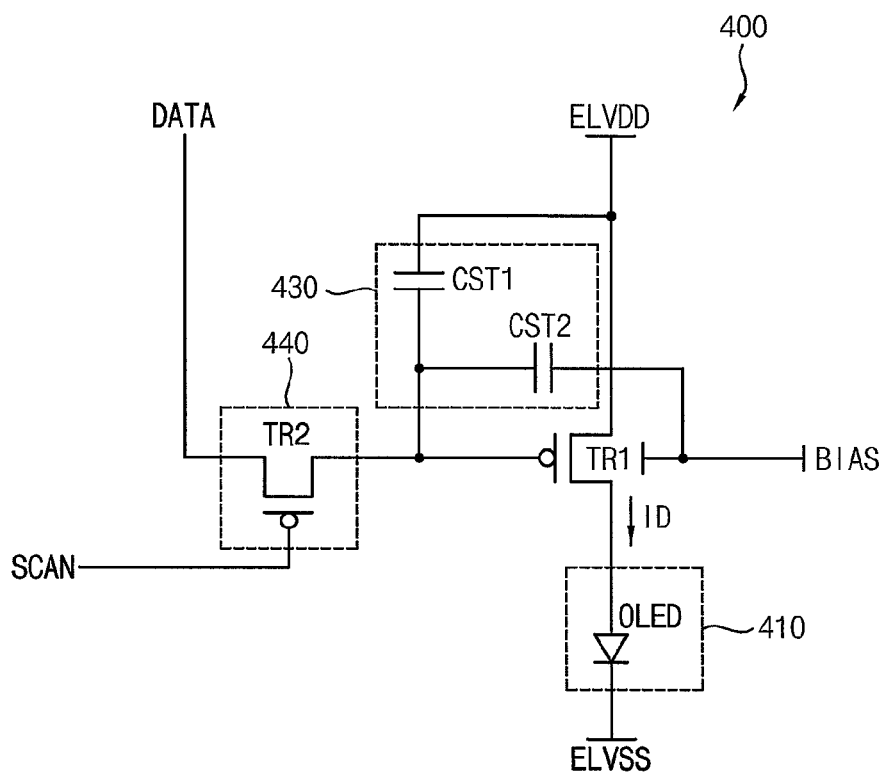
FIG. 9 is a circuit diagram illustrating another example of the pixel of FIG. 1.

FIG. 9 is a circuit diagram illustrating another example of the pixel of FIG. 1.

Referring to FIG. 9, the pixel 400 includes an emission part or emitter 410, a driving transistor TR1, a data voltage holding part or data voltage holding circuit 430, and a data voltage providing part or data voltage providing circuit 440.

The emission part 410 can include an OLED that emits light based on a driving current ID. The OLED can include a first electrode and a second electrode. Here, the first electrode can be connected to the second electrode of the driving transistor TR1. The second electrode can receive a second power voltage ELVSS.

The data voltage providing part 440 can include a data providing transistor TR2. The data providing transistor TR2 can include a first electrode, a second electrode, and a gate electrode. Here, the first electrode can receive the data voltage DATA. The second electrode can be connected to the first gate electrode of the driving transistor TR1. The gate electrode can receive the scan signal SCAN. The data providing transistor TR2 can provide the data voltage DATA to the first gate electrode of the driving transistor TR1 while the scan signal SCAN is activated.

The data voltage holding part 430 can include a first storage capacitor CST1 and a second storage capacitor CST2. The first storage capacitor CST1 can be connected between a first power voltage ELVDD and the first gate electrode of the driving transistor TR1. The second storage capacitor CST2 can be connected between a bias voltage BIAS and the first gate electrode of the driving transistor TR1. The first storage capacitor CST1 and the second storage capacitor CST2 can maintain the voltage of the first gate electrode of the driving transistor TR1 while the emission part 410 emits light.

The driving transistor TR1 can include a first electrode, a second electrode, a first gate electrode, and a second gate electrode. Here, the second gate electrode can receive the bias voltage BIAS. The driving transistor TR1 can generate a driving current ID based on the data voltage DATA applied to the first gate electrode.

As a result, the swing width of the driving current ID according to a swing of the data voltage DATA is adjusted based on the bias voltage BIAS, thereby reducing a luminance variation of emission part 410.

Figure 10:
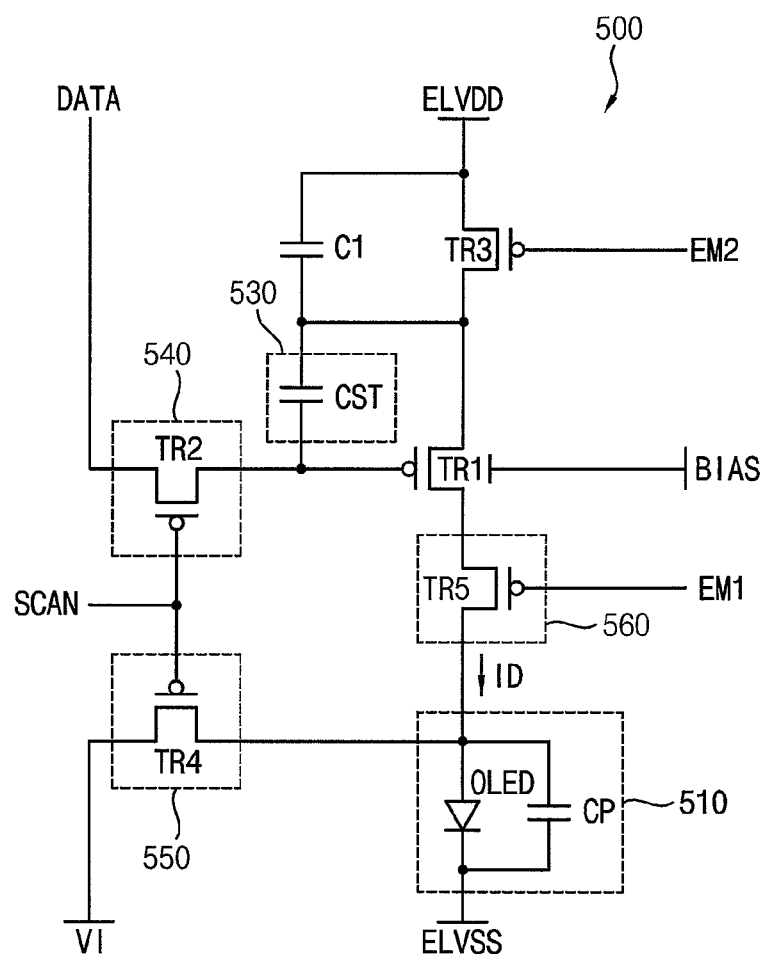
FIG. 10 is a circuit diagram illustrating still another example of the pixel of FIG. 1.

FIG. 10 is a circuit diagram illustrating still another example of the pixel of FIG. 1.

Referring to FIG. 10, the pixel 500 includes an emission part or emitter 510, a driving transistor TR1, a data voltage holding part or data voltage holding circuit 530, a data voltage providing part or data voltage providing circuit 540, an initialization voltage providing part or initialization voltage providing circuit 550, an emission control part or emission controller 560. In addition, the pixel 500 can further include a source voltage holding capacitor C1 and a power control transistor TR3.

The emission part 510 can include an OLED that emits light based on a driving current ID. The OLED can include a first electrode and a second electrode. Here, the second electrode can receive a second power voltage ELVSS.

The data voltage holding part 530 can include a storage capacitor CST. The storage capacitor CST can be connected between a first electrode of the driving transistor TR1 and a gate electrode of the driving transistor TR1.

The initialization voltage providing part 550 can include an initialization transistor TR4. The initialization transistor TR4 can include a first electrode, a second electrode, and a gate electrode. Here, the first electrode can receive the initialization voltage VI. The second electrode can be connected to the first electrode of the OLED. The gate electrode can receive the scan signal SCAN.

The data voltage providing part 540 can include a data providing transistor TR2. The data providing transistor TR2 can include a first electrode, a second electrode, and a gate electrode. Here, the first electrode can receive the data voltage DATA. The second electrode can be connected to the first gate electrode of the driving transistor TR1. The gate electrode can receive the scan signal SCAN.

The source voltage holding capacitor C1 can be connected between a first power voltage ELVDD and the first electrode of the driving transistor TR1.

The power control transistor TR3 can include a first electrode, a second electrode, and a gate electrode. Here, the first electrode can receive the first power voltage ELVDD. The second electrode can be connected to the first electrode of the driving transistor TR1. The gate electrode can receive the second emission signal EM2

The emission control part 560 can include an emission control transistor TR5. The emission control transistor TR5 can include a first electrode, a second electrode, and a gate electrode. Here, the first electrode can be connected to the second electrode of the driving transistor TR1. The second electrode can be connected to the first electrode of the OLED. The gate electrode can receive the first emission signal EM1.

When the scan signal SCAN and the first emission signal EM1 are activated and the second emission signal EM2 is deactivated, the data voltage DATA having a reference voltage level can be applied to the first gate electrode of the driving transistor TR1 via the data providing transistor TR2. As a result, the source voltage holding capacitor C1 and the storage capacitor CST are discharged through the driving transistor TR1 until a voltage difference between the first electrode and the first gate electrode of the driving transistor TR1 reaches a threshold voltage of the driving transistor TR1. Therefore, a voltage difference of both electrodes of the storage capacitor CST is substantially the same as the threshold voltage of the driving transistor TR1. Thus, the storage capacitor CST can store the threshold voltage.

When the scan signal SCAN is activated and the first emission signal EM1 and the second emission signal EM2 are deactivated, the data voltage DATA for presenting the grayscale can be applied to the first gate electrode of the driving transistor TR1 via the data providing transistor TR2. A floating state of a voltage of the first electrode of the driving transistor TR1 can be changed by boosting the storage capacitor CST. When a capacitance of the source voltage holding capacitor C1 is sufficiently greater than a capacitance of the storage capacitor CST, the voltage changing in the first electrode of the driving transistor TR1 is relatively small. Thus, when a voltage of the first gate electrode of the driving transistor TR1 is based on a first voltage change amount, a voltage of the first electrode of the driving transistor TR1 can be based on a second voltage change amount less than the first voltage change amount. Therefore, a voltage difference between both electrodes of the storage capacitor CST can be determined.

When the second emission signal EM2 is activated and the first emission signal EM1 and the scan signal SCAN are deactivated, a voltage of the first electrode of the driving transistor TR1 can be changed to the first power voltage ELVDD. Since the first gate electrode of the driving transistor TR1 is floating, the voltage of the first gate electrode can be changed based on the change amount of the storage capacitor CST. Thus, the voltage of the first gate electrode of the driving transistor TR1 corresponding to a second electrode of the storage capacitor CST can be determined by changing a voltage of a first electrode of the storage capacitor CST.

When the first and second emission signals EM1 and EM2 are activated and the scan signal SCAN is deactivated, the driving transistor TR1 can adjust the driving current ID based on a voltage difference between the first electrode and the first gate electrode of the driving transistor TR1. The OLED can emit the light based on the driving current ID.

As a result, the swing width of the driving current ID according to a swing of the data voltage DATA is adjusted based on the bias voltage BIAS applied to the second gate electrode of the driving transistor TR1, thereby reducing a luminance variation of emission part 510.

Figure 11:
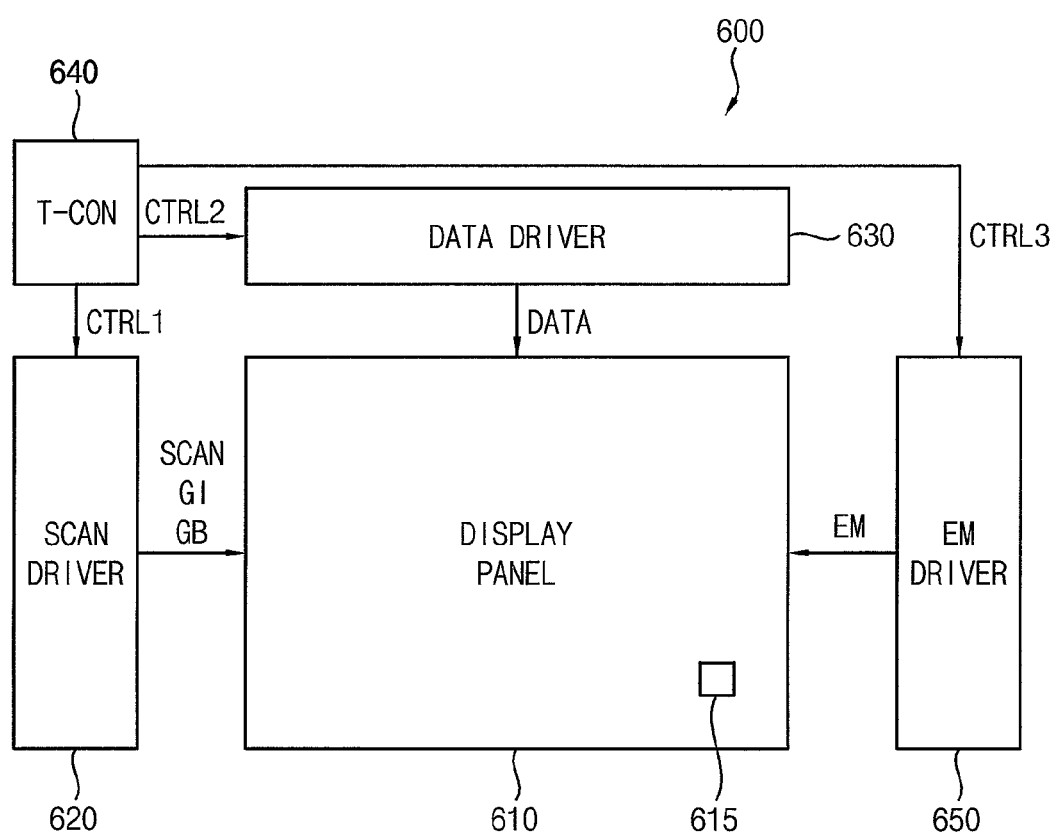
FIG. 11 is a block diagram illustrating a display device according to example embodiments.

FIG. 11 is a block diagram illustrating a display device according to example embodiments.

Referring to FIG. 11, the display device 600 includes a display panel 610, a scan driver 620, a data driver 630, and a timing controller 640. In some embodiments, the display device 600 further includes an emission driver 650.

The scan driver 620 can provide a scan signal SCAN to the display panel 610. The data driver 630 can provide a data voltage DATA to the display panel 610. The emission driver 650 can provide an emission signal EM to the display panel 610. The timing controller 640 can control the scan driver 620 based on the first control signal CTRL1. The timing controller 640 can control the data driver 630 based on the second control signal CTRL2. In some embodiments, the timing controller 640 controls the emission driver 650 based on the third control signal CTRL3.

The display panel 610 can include a pixel 615.

The pixel 615 can include an emission part, a driving transistor, a data voltage holding part, and a data voltage providing part. In some embodiments, the pixel 615 can further include an initialization voltage providing part and an emission control part.

The emission part can emit light based on a driving current. The emission part can include an OLED. Also, the emission part can further include a diode parallel capacitor connected in parallel with the OLED. In some embodiments, the diode parallel capacitor can be connected between both electrodes of the OLED and can be parasitic capacitor.

The driving transistor can include an active layer, a first electrode, a second electrode, a first gate electrode, and a second gate electrode. The first electrode can be connected to a first end portion of the active layer. The second electrode can be connected to a second end portion of the active layer. The first gate electrode can receive a data voltage DATA by which a channel is formed in the active layer such that the driving current is adjusted as the channel is formed in the active layer. The second gate electrode can receive a bias voltage BIAS. In some embodiments, a swing width of the driving current according to a swing of the data voltage DATA is adjusted based on the bias voltage BIAS applied to the second gate electrode of the driving transistor. In some embodiments, a magnitude of a threshold voltage of the driving transistor can be adjusted based on the bias voltage BIAS applied to the second gate electrode of the driving transistor.

The data voltage holding part can substantially maintain a voltage of the first gate electrode of the driving transistor while the emission part emits the light. In some embodiments, the data voltage holding part can include a first storage capacitor. In some embodiments, the data voltage holding part can further include a second storage capacitor. The second storage capacitor can maintain the voltage of the first gate electrode of the driving transistor with the first storage capacitor, thereby reducing a size of the data voltage holding part.

The data voltage holding part can maintain the data voltage DATA applied to the first gate electrode of the driving transistor and an initialization voltage for a predetermined period.

The data voltage providing part can provide the data voltage DATA to the first gate electrode of the driving transistor in response to a scan signal SCAN. In some embodiments, the data voltage providing part can provide a compensated data voltage that is generated by compensating the data voltage by a threshold voltage of the driving transistor to the driving transistor. In some embodiments, the data voltage providing part can include the driving transistor.

The initialization voltage providing part can provide the initialization voltage for initializing the emission part to the emission part. In this case, the initialization voltage providing part can provide the initialization voltage to the emission part based on a diode initialization signal GB. In some embodiments, the initialization voltage providing part provides the initialization voltage to the driving transistor. In this case, the initialization voltage providing part can provide the initialization voltage to the driving transistor based on an initialization signal GI.

The emission control part can control the light emitted by the emission part based on a first emission signal. For example, the emission control part can electrically connect the driving transistor to the emission part while the first emission signal is activated, and can electrically disconnect the driving transistor from the emission part while the first emission signal is deactivated.

Therefore, the pixel includes the driving transistor having a double gate structure and the second gate electrode of the driving transistor receives a bias voltage. Therefore, the pixel reduces a luminance variation of emission parts because a swing width of a driving current according to a swing of the data voltage is adjusted based on the bias voltage. Further, a channel length of the driving transistor can be reduced because characteristics of the driving transistor are enhanced. Therefore, the pixel of which size is relatively small can be manufactured and the display device 600 can display a high resolution image.

The described technology can be applied to an electronic device having the display device. For example, the described technology is applied to cellular phones, smartphones, smart pads, personal digital assistants (PDAs), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive technology. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pixel comprising:
    an emitter configured to emit light based at least in part on a driving current;
    a driving transistor including an active layer, a first electrode electrically connected to a first end portion of the active layer, a second electrode electrically connected to a second end portion of the active layer, a first gate electrode configured to receive a data voltage from a data driver so as to form a channel in the active layer, and a second gate electrode configured to receive a bias voltage from a voltage source, wherein the channel is configured to adjust the driving current;
    a data voltage holding circuit configured to maintain a voltage of the first gate electrode while the emitter emits the light; and
    a data voltage providing circuit configured to transmit the data voltage to the first gate electrode based at least in part on a scan signal.

2. The pixel of claim 1, wherein a swing width of the driving current according to a swing of the data voltage is adjusted based on the bias voltage applied to the second gate electrode.

3. The pixel of claim 1, wherein a magnitude of a threshold voltage of the driving transistor is adjusted based on the bias voltage applied to the second gate electrode.

4. The pixel of claim 1, further comprising:
    an emission controller configured to control the light emitted by the emitter based at least in part on a first emission signal; and
    an initialization voltage providing circuit configured to transmit an initialization voltage to the emitter so as to initialize the emitter.

5. The pixel of claim 4, further comprising:
a source voltage holding capacitor electrically connected between a first power voltage and the first electrode of the driving transistor; and
a power control transistor including a first electrode configured to receive the first power voltage, a second electrode electrically connected to the first electrode of the driving transistor, and a gate electrode configured to receive the second emission signal from an emission driver,
wherein the data voltage holding circuit includes a storage capacitor electrically connected between the first electrode and the first gate electrode of the driving transistor,
wherein the emitter includes an organic light-emitting diode (OLED) including a first electrode and a second electrode configured to receive a second power voltage from a second power source,
wherein the initialization voltage providing circuit includes an initialization transistor including a first electrode configured to receive the initialization voltage, a second electrode electrically connected to the first electrode of the OLED, and a gate electrode configured to receive the scan signal from a scan driver,
wherein the emission controller includes an emission control transistor including a first electrode electrically connected to the second electrode of the driving transistor, a second electrode electrically connected to the first electrode of the OLED, and a gate electrode configured to receive the first emission signal from the emission driver, and
wherein the data voltage providing circuit includes a data providing transistor including a first electrode configured to receive the data voltage from a data driver, a second electrode electrically connected to the first gate electrode of the driving transistor, and a gate electrode configured to receive the scan signal from the scan driver.

6. The pixel of claim 4, wherein the data voltage providing circuit is further configured to compensate the data voltage with the threshold voltage of the driving transistor so as to transmit a compensated data voltage to the first gate electrode of the driving transistor.

7. The pixel of claim 6, wherein the data voltage providing circuit includes the driving transistor.

8. The pixel of claim 6, wherein the data voltage holding circuit includes:
a first storage capacitor electrically connected between a first power voltage and the first gate electrode of the driving transistor; and
a second storage capacitor electrically connected between the bias voltage and the first gate electrode of the driving transistor,
wherein the emitter includes an organic light-emitting diode (OLED) including a first electrode and a second electrode configured to receive a second power voltage from a second power source,
wherein the initialization voltage providing circuit includes:
 a first initialization transistor including a first electrode configured to receive the initialization voltage from an initialization voltage generator, a second electrode electrically connected to the first gate electrode of the driving transistor, and a gate electrode configured to receive a data initialization signal from a scan driver; and
 a second initialization transistor including a first electrode configured to receive the initialization voltage from the initialization voltage generator, a second electrode electrically connected to the first electrode of the OLED, and a gate electrode configured to receive a diode initialization signal from the scan driver,
wherein the emission controller includes an emission control transistor including a first electrode electrically connected to the second electrode of the driving transistor, a second electrode electrically connected to the first electrode of the OLED, and a gate electrode configured to receive the first emission signal from an emission driver, and
wherein the data voltage providing circuit includes:
 the driving transistor;
 a power control transistor including a first electrode configured to receive the first power voltage from a first power source, a second electrode electrically connected to the first electrode of the driving transistor, and a gate electrode configured to receive the first emission signal from the emission driver;
 a data providing transistor including a first electrode configured to receive the data voltage from a data driver, a second electrode electrically connected to the first electrode of the driving transistor, and a gate electrode configured to receive the scan signal from the scan driver; and
 a connection transistor including a first electrode electrically connected to the second electrode of the driving transistor, a second electrode electrically connected to the first gate electrode of the driving transistor, and a gate electrode configured to receive the scan signal from the scan driver.

9. The pixel of claim 8, wherein the first initialization transistor is further configured to transmit the initialization voltage to the driving transistor while the data initialization signal is activated,
wherein the second initialization transistor is further configured to provide the initialization voltage to the OLED while the diode initialization signal is activated,
wherein the emission control transistor is configured to i) electrically connect the driving transistor to the emitter while the first emission signal is activated and ii) electrically disconnect the driving transistor from the emitter while the first emission signal is deactivated,
wherein the power control transistor is configured to i) electrically connect the first power voltage to the driving transistor while the first emission signal is activated and ii) electrically disconnect the first power voltage from the driving transistor while the first emission signal is deactivated,
wherein the data providing transistor is configured to transmit the data voltage to the first electrode of the driving transistor while the scan signal is activated,
wherein the connection transistor is configured to electrically connect the first gate electrode of the driving transistor to the second electrode of the driving transistor while the scan signal is activated so as to form a diode connection, and
wherein the driving transistor is configured to i) transmit the compensated data voltage based at least in part on the diode connection to the first gate electrode while the scan signal is activated, and ii) adjust the driving current based at least in part on the compensated data voltage while the first emission signal is activated.

10. The pixel of claim 1, wherein the data voltage holding circuit includes:
   a first storage capacitor electrically connected between a first power voltage and the first gate electrode of the driving transistor; and
   a second storage capacitor electrically connected between the bias voltage and the first gate electrode of the driving transistor,
   wherein the emitter includes an organic light-emitting diode (OLED) including i) a first electrode electrically connected to the second electrode of the driving transistor and ii) a second electrode configured to receive a second power voltage from a second power source, and
   wherein the data voltage providing circuit includes a data providing transistor including a first electrode configured to receive the data voltage, a second electrode electrically connected to the first gate electrode of the driving transistor, and a gate electrode configured to receive the scan signal from a scan driver.

11. A display device comprising:
   a display panel including a pixel;
   a scan driver configured to provide a scan signal to the display panel;
   a data driver configured to provide a data voltage to the display panel; and
   a timing controller configured to control the scan driver and the data driver,
   wherein the pixel includes:
      an emitter configured to emit light based at least in part on a driving current;
      a driving transistor including an active layer, a first electrode electrically connected to a first end portion of the active layer, a second electrode electrically connected to a second end portion of the active layer, a first gate electrode configured to receive a data voltage from a data driver so as to form a channel in the active layer, and a second gate electrode configured to receive a bias voltage from a voltage source, wherein the channel is configured to adjust the driving current;
      a data voltage holding circuit configured to maintain a voltage of the first gate electrode while the emitter emits the light; and
      a data voltage providing circuit configured to transmit the data voltage to the first gate electrode based at least in part on a scan signal.

12. The display device of claim 11, wherein a swing width of the driving current according to a swing of the data voltage is adjusted based on the bias voltage applied to the second gate electrode.

13. The display device of claim 11, wherein a magnitude of a threshold voltage of the driving transistor is adjusted based on the bias voltage applied to the second gate electrode.

14. A thin film transistor (TFT) substrate for a display device, the TFT substrate comprising:
   a substrate;
   a bottom gate pattern formed over the substrate;
   a first gate insulation layer formed over the substrate and covering the bottom gate pattern;
   an active pattern formed over the first gate insulation layer and including a first region and a second region;
   a second gate insulation layer formed over the first gate insulation layer and covering the active pattern; and
   a first top gate pattern formed over the second gate insulation layer so as to form a driving transistor having a double gate structure including the first region, the second region, and the first gate insulation layer,
   wherein the driving transistor is configured to generate a driving current.

15. The TFT substrate of claim 14, wherein the bottom gate pattern is configured to receive a bias voltage from a voltage source, and wherein the first top gate pattern is configured to receive a data voltage from a data driver.

16. The TFT substrate of claim 15, wherein a swing width of the driving current according to a swing of the data voltage is adjusted based on the bias voltage applied to the second gate electrode.

17. The TFT substrate of claim 15, wherein a magnitude of a threshold voltage of the driving transistor is adjusted based on the bias voltage applied to the second gate electrode.

18. The TFT substrate of claim 15, wherein the active pattern includes third through fourteenth regions.

19. The TFT substrate of claim 18, further comprising:
   a second top gate pattern formed over the second gate insulation layer so as to form i) a data providing transistor with the third region and the fourth region and ii) a connection transistor with the fifth region and the sixth region;
   a third top gate pattern formed over the second gate insulation layer so as to form a first initialization transistor with the seventh region and the eighth region;
   a fourth top gate pattern formed over the second gate insulation layer so as to form i) a power control transistor with the ninth region and the tenth region and ii) an emission control transistor with the eleventh region and the twelfth region; and
   a fifth top gate pattern formed over the second gate insulation layer so as to form a second initialization transistor with the thirteenth region and the fourteenth region.

20. The TFT substrate of claim 19, further comprising:
   an insulation interlayer formed over the second gate insulation layer and covering the first through fifth top gate patterns; and
   a capacitor pattern formed over the insulation interlayer so as to form a storage capacitor with the first top gate pattern.

* * * * *